(12) United States Patent
Mitrovic et al.

(10) Patent No.: US 7,186,313 B2
(45) Date of Patent: Mar. 6, 2007

(54) PLASMA CHAMBER WALL SEGMENT TEMPERATURE CONTROL

(75) Inventors: Andrej S Mitrovic, Phoenix, AZ (US); Maolin Long, Santa Clara, CA (US); Paul Moroz, Marblehead, MA (US); Steven T Fink, Mesa, AZ (US); William D Jones, Phoenix, AZ (US)

(73) Assignee: Tokyo Electron Limited, Tokyo (JP)

( * ) Notice: Subject to any disclaimer, the term of this patent is extended or adjusted under 35 U.S.C. 154(b) by 262 days.

(21) Appl. No.: 10/765,445

(22) Filed: Jan. 28, 2004

(65) Prior Publication Data

US 2004/0211660 A1    Oct. 28, 2004

Related U.S. Application Data

(63) Continuation of application No. PCT/US02/23207, filed on Jul. 19, 2002.

(60) Provisional application No. 60/308,447, filed on Jul. 30, 2001.

(51) Int. Cl.
*H01L 21/306* (2006.01)

(52) U.S. Cl. .................. 156/345.37; 156/345.35; 118/723 R; 118/723 MW; 118/724

(58) Field of Classification Search ........... 156/345.35, 156/345.37; 118/723 R, 723 MW, 724
See application file for complete search history.

(56) References Cited

U.S. PATENT DOCUMENTS 5,477,975 A * 12/1995 Rice et al. .................. 216/68
6,113,732 A    9/2000 Yoshida et al.

FOREIGN PATENT DOCUMENTS

EP          0 838 841 A2    4/1998
WO          WO 99/25494     5/1999

* cited by examiner

*Primary Examiner*—Shamim Ahmed
(74) *Attorney, Agent, or Firm*—Pillsbury Winthrop Shaw Pittman LLP

(57) ABSTRACT

A device and method for controlling the temperature of a plasma chamber inside wall or other surfaces exposed to the plasma by a plurality of temperature control systems. A plasma process within the plasma chamber can be controlled by independently controlling the temperature of segments of the wall or other surfaces.

13 Claims, 5 Drawing Sheets

PLASMA CHAMBER WALL SEGMENT TEMPERATURE CONTROL

This is a continuation of International Application No. PCT/US02/23207, filed on Jul. 19, 2002, which, in turn, claims the benefit from U.S. Provisional Patent Application No. 60/308,447, filed Jul. 30, 2001, the entire contents of both of which are incorporated herein by reference.

BACKGROUND OF THE INVENTION

1. Field of the Invention

The invention relates in general to plasma chambers and, more particularly, to a plasma chamber that has a wall temperature control system.

2. Description of Related Art

Plasma chambers may be used to contain plasma, for example, in a plasma semiconductor substrate processing tool. Typically, plasma ions are accelerated toward a semiconductor substrate within the plasma chamber. During the course of the process, ions, neutral particles, and contaminants are pumped out of the chamber while fresh gas is supplied and formed into plasma.

The chamber wall temperature affects the local surface chemistry, e.g. the nature and amounts of different chemical species adsorbed and emitted from the walls. These species in turn affect the local gas phase chemistry in the plasma, and thus the plasma process result, e.g. rate, selectivity, etc.

With the current trend of introducing in-situ chamber cleaning steps between wafer batches, fast ramp-up and ramp-down of wall temperatures can be advantageous.

SUMMARY OF THE INVENTION

The present invention provides an apparatus and a method of independently controlling the temperature of different segments of the plasma chamber inside wall, and/or other surfaces exposed to the chamber plasma. The temperature of segments of the plasma chamber inside walls and other surfaces are independently controlled by a plurality of temperature control systems.

DETAILED DESCRIPTION OF THE EMBODIMENTS

Figure 1:
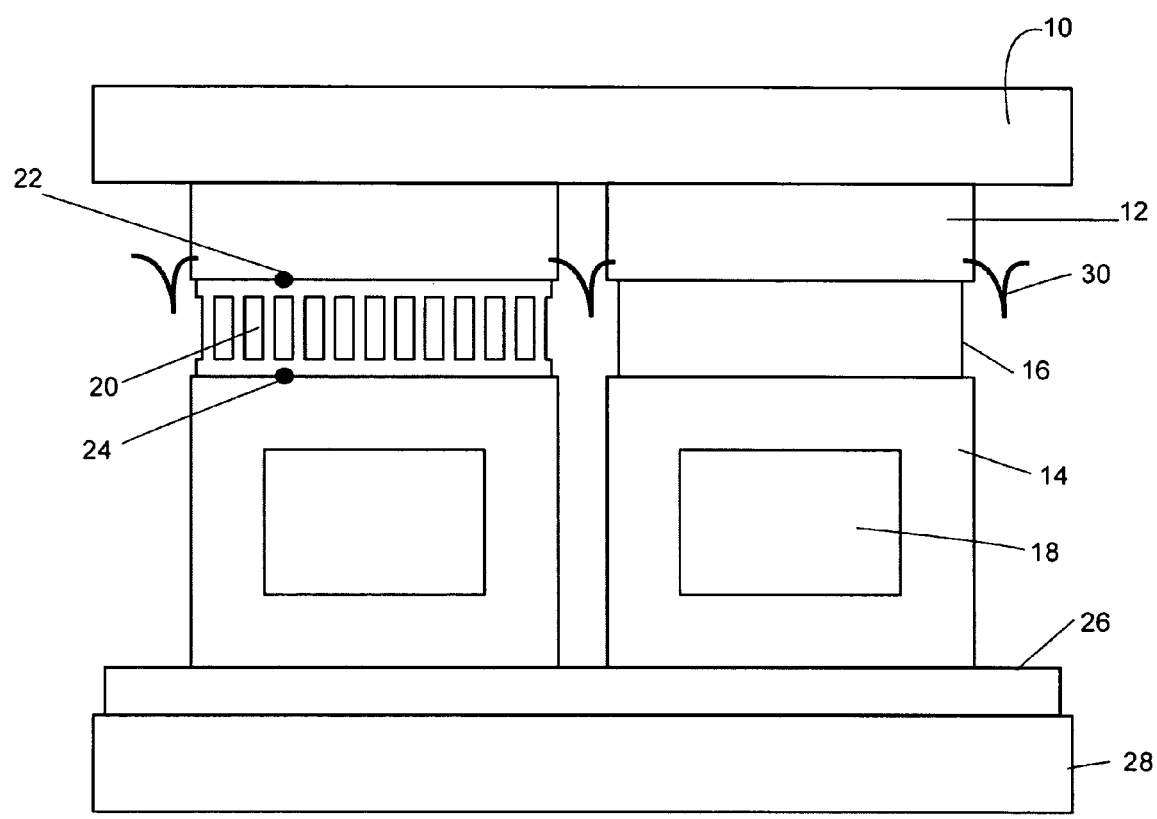
FIG. 1 is a schematic representation of two segments of the plasma chamber wall temperature control system.

FIG. 1 shows the structure of two segments of the plasma wall temperature control system. The inside of the plasma chamber is defined by a plasma chamber inside wall, indicated at 10. At least an inner portion of the plasma chamber inside wall 10 may be made of a ceramic-type material, which typically has a low thermal conductivity, such as quartz, alumina, yttria, etc. Materials of low thermal conductivity allow improved independent temperature control of various segments of the plasma chamber inside wall 10. Materials with a higher thermal conductivity, such as anodized aluminum, stainless steel, or the like can also be used.

A thermal conductor, indicated at 12, is seated in thermal contact with the back side of a segment of the plasma chamber inside wall 10. The thermal conductor 12 may be made of a material with a high thermal conductivity, for example a metal such as aluminum. The left and right segments of the plasma wall temperature control system shown in FIG. 1 each contain a thermal conductor 12. Each thermal conductor 12 controls the temperature of a segment of the plasma chamber inside wall 10. Each thermal conductor 12 is in direct contact with either a thermoelectric device, indicated at 20, or a "dummy" insert, indicated at 16. Referring to the left segment, the thermal conductor 12 is in direct contact with the thermoelectric device 20. Referring to the right segment, the thermal conductor 12 is in direct contact with a dummy insert 16. The dummy insert 16 in the segment of the plasma wall temperature control system without the thermoelectric device 20 mimics the thermal properties, e.g. nominal heat conductance, of the thermoelectric device 20.

Referring to the right segment of FIG. 1, the dummy insert 16 is in direct contact with a temperature controlling block, indicated at 14. Temperature controlling block 14 has a conduit, indicated at 18, to carry a fluid. For those segments that contain a thermoelectric device 20, the thermoelectric device 20 is in direct contact with the temperature controlling block 14. The fluid in the conduit 18 of the temperature controlling block 14 can either heat or cool the segment of the plasma chamber inside wall 10, depending on the fluid temperature. Heating or cooling is by direct thermal conduction, from the fluid to the segment of the plasma chamber inside wall 10, via the conduit 18 of the temperature controlling block 14, dummy insert 16 or thermoelectric device 20, and thermal conductor 12. The thermoelectric device 20 can allow higher precision and generally faster response temperature control of the segment of the plasma chamber inside wall 10, by varying the current and voltage supplied to the thermoelectric device 20 by a variable DC power source (not illustrated).

Thermocouples 22 and 24 determine the temperatures on both sides of the thermoelectric device 20. The thermoelectric device 20 can be disconnected from the DC power source so that the voltage and current into the known load of the thermoelectric device 20 can be used to determine the heat flow through it. Heat flow information can be used for plasma chamber process control. If higher resolution temperature control is required, all temperature control segments may have thermoelectric devices 20 installed. If only measurement of heat flow is required, not all temperature control segments may have thermoelectric devices 20 installed.

A layer of heat insulation material, indicated at 26, prevents heat exchange between temperature controlling blocks 14 via the plasma chamber outside wall, indicated at 28. Segments of the plasma wall temperature control system are spaced apart so that they do not touch each other, preventing heat exchange via direct thermal conduction. The insulation 26 acts to hold the temperature control systems against the outside surface of chamber inside wall 10. If other means of holding temperature control systems against wall 10 are used, insulators 26 may be omitted, and the gas that fills the space between walls 10 and 28 then provides the insulation.

RF shielding of the plasma chamber may be included, depending on the type of plasma generator used. A thin metal foil, indicated at 30, bridges the space between the thermal conductors 12. Heat exchange between conductors 12 is minimized because the foil 30 is thin. The foil 30 completes an electrically continuous RF energy shield around the plasma chamber.

Figure 2:
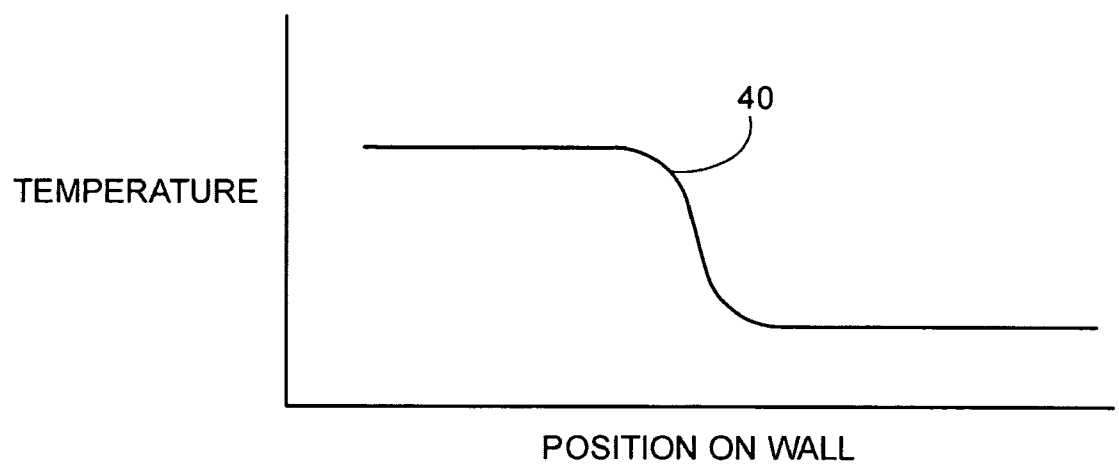
FIG. 2 is a graph showing a temperature distribution along the chamber wall of FIG. 1.

FIG. 2 shows a graph exemplifying an achievable temperature distribution along the plasma chamber inside wall 10. The sharp temperature step, indicated at 40, between the two segments of the plasma chamber inside wall 10, is partly achievable due to the low thermal conductivity of the material, partly due to small thickness of the plasma chamber inside wall 10.

Figure 3:
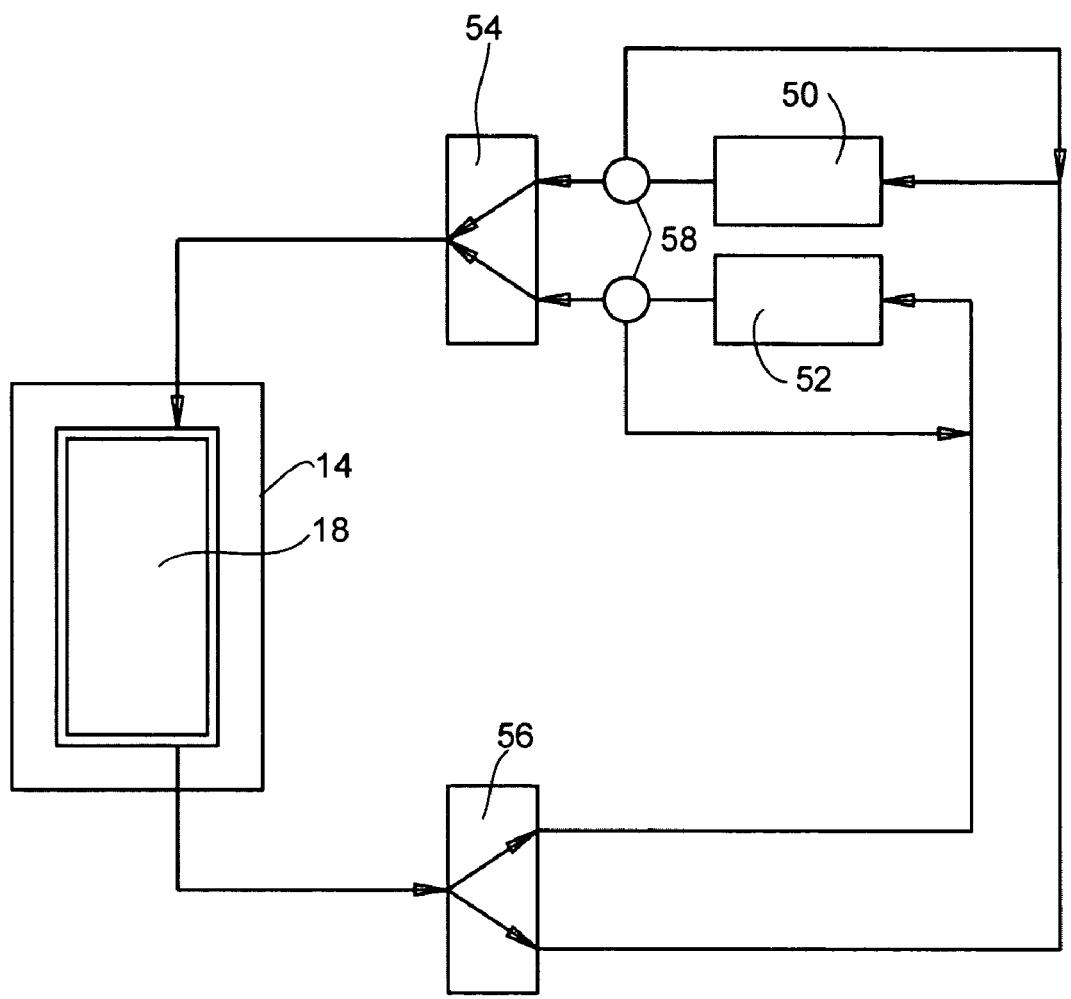
FIG. 3 is a schematic representation of a fluid circulation system used to feed cooling or heating fluid to the plasma chamber wall temperature control segments.

FIG. 3 shows a fluid circulation system used to supply heating or cooling fluid to the conduits 18 of the temperature controlling blocks 14 of the plasma wall temperature control system. Two high-flow fluid sources can be used. A higher-temperature fluid source, indicated at 50, provides a fluid of as high or higher temperature than the highest required temperature of any plasma chamber process. A lower-temperature fluid source, indicated at 52, provides a fluid of as low or lower temperature than the lowest required temperature of any plasma chamber process.

A selector valve, indicated at 54, selectively sends either higher-temperature or lower-temperature fluid to the conduit 18. Varying which fluid is sent allows control of the temperature of the plasma chamber inside wall 10. The selector valves 54 and 56 are located near the conduits 18, reducing the amount of fluid needing replacement when a temperature change is needed.

The thermoelectric devices 20 provide higher precision temperature control, and can sustain a temperature difference of, for example, a few tens of degrees. The temperature difference can compensate for a fluid that does not yet have the exact desired temperature necessary for the plasma chamber process. The thermoelectric devices are provided with varying current and voltage to compensate for or sustain any temperature differences required for wall segment temperature control. The thermoelectric devices are also able to adjust their temperatures more rapidly than the fluid system.

Figure 4:
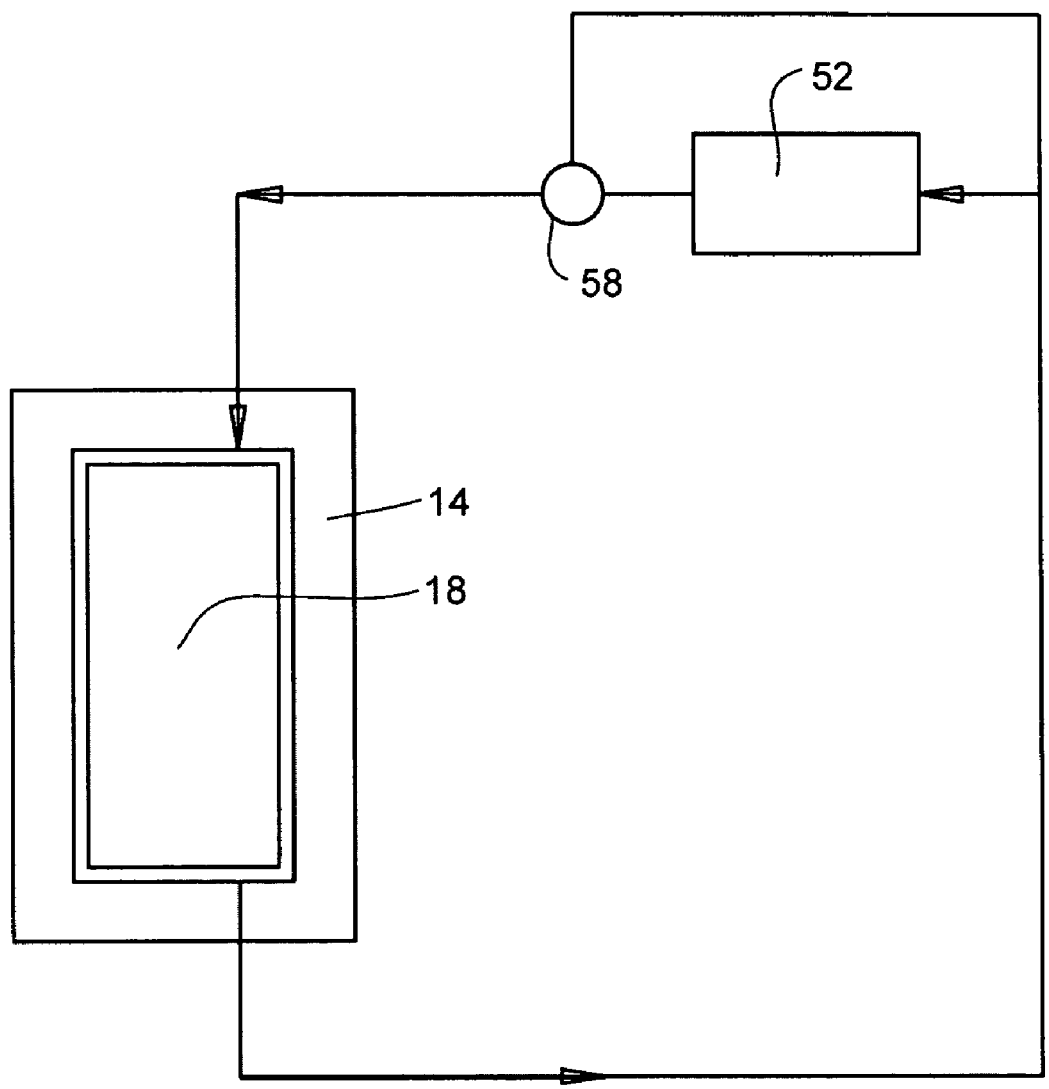
FIG. 4 is a schematic representation of a fluid circulation system used to feed cooling fluid to the plasma chamber wall temperature control segments.

If a fluid source 50 or 52 is not in use, it may be put in a bypass position via a relief valve, indicated at 58. The bypassed fluid circulates through the fluid circulation system, always ready for the next temperature change. In another embodiment, the selector valve 54 may be a liquid mixing valve, allowing selective combination of the heating and cooling fluids to set the fluid at a desired temperature for steady state conditions, or heating only or cooling only, for quick heating or cooling. A further embodiment eliminates the heating fluid 50 and selector valves 54 and 56 from the fluid circulation system by using resistive heaters (which may also be the same device as the thermoelectric device 20) for heating. FIG. 4 shows the simplified cooling fluid circulation system. On-off valves (which may also be the same valve as the relief valve 58) can be used in the simplified cooling fluid circulation system. This embodiment can provide a highly controlled heat-up process, via current and voltage supplied to the resistive heater.

Figure 5:
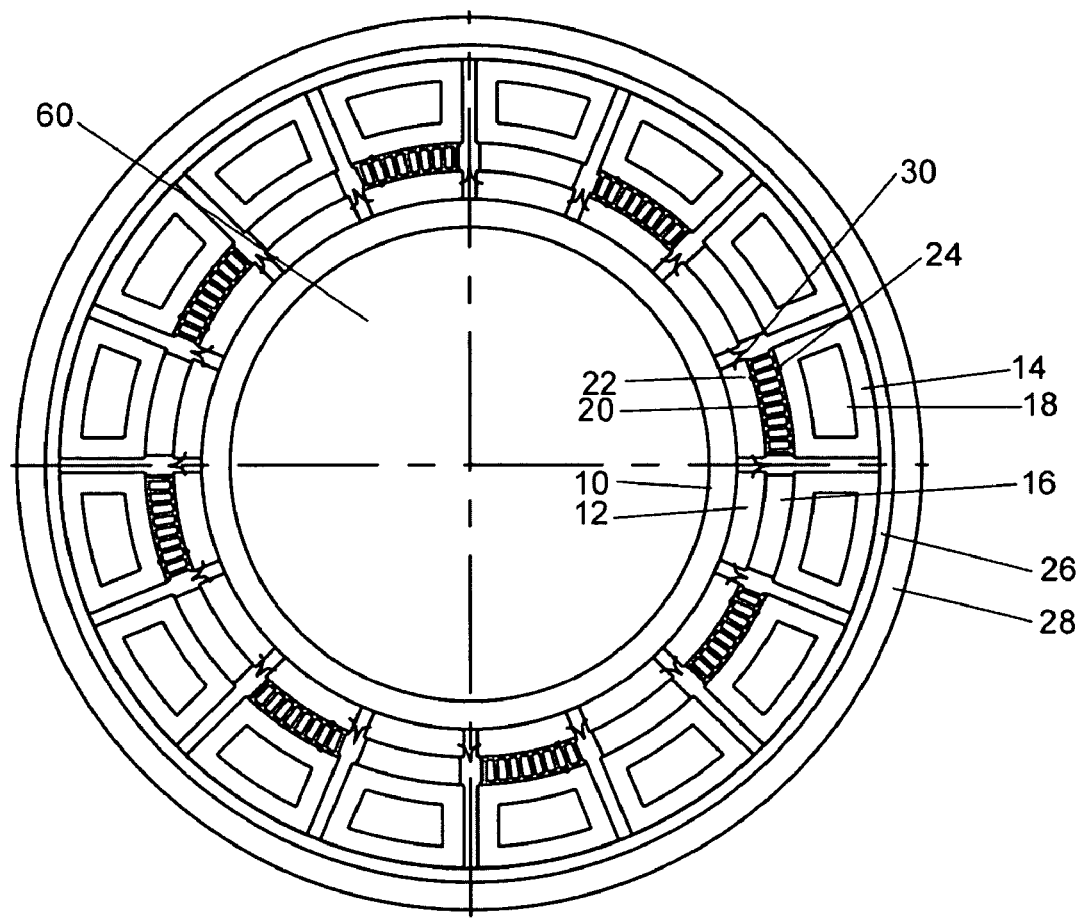
FIG. 5 is an overhead view of a plasma chamber utilizing the plasma chamber wall temperature control system illustrated in FIG. 1.

The temperature and heat flow measured by the thermocouples 22, 24 and the thermoelectric devices 20 can be used in a feedback control system to maintain a desired plasma chamber inside wall temperature over each segment of the chamber wall 10. The temperature and heat flow can also be used to monitor the plasma process being carried out in the plasma chamber. Plasma processing can be controlled based on the feedback from the temperature and heat flow information. The temperature of a portion of the wall can be measured and correlated to parameters of the plasma process. The parameters of the plasma process can then be adjusted as necessary by adjusting the temperature control systems. FIG. 5 shows the segments of the plasma wall temperature control system arranged to surround the plasma chamber 60.

The wall temperature distribution can be correlated to the process properties, such as etch rate, selectivity, device damage, repeatability, etc., via a design-of-experiments (DOE) approach, in which a large number of tests are made, so that a meaningful correlation is obtained. This correlation may be programmed in the form of a look-up table database in the tool controller. Then, during a process, when a temperature distribution on the wall is known from measurements at each individual segment, an estimate of the achievable process results can be obtained using various methods known in the art. If this uniformity is not satisfactory, then a control signal is sent to all segments to adjust their temperatures to a setpoint where the desired process results are obtained, in combination, of course, with other operating parameters of the current process in the tool. With all segments individually controllable, one can also achieve azimuthal process results control. The heat flux information is useful for quantifying the plasma bombardment of the wall. A high heat flux means that the wall is subjected to a high ion bombardment flux, which invariably causes sputtering of the wall material. This can contaminate the process and reduce the lifetime of the chamber wall, increasing costs. If a particularly "clean" process needs to be achieved, then the heat flux information can be used to adjust process parameters so that wall bombardment is minimized.

Likewise, the system may be used, for example, to reduce the time necessary between process steps. For example, between wafers, the chamber may be cleaned at a temperature higher than the wafer process. The system according to the present invention allows rapid chamber heating so that throughput may be increased.

The same segmented temperature control system may be used on the substrate holder assembly, the gas injection plate, and in other locations in the chamber where precise wall temperature control is required for good process results.

It will thus be seen that the objects of this invention have been fully and effectively accomplished. It will be realized, however, that the foregoing preferred specific embodiments have been shown and described for the purpose of illustrating the functional and structural principles of this invention and are subject to change without departure from such principles. Therefore, this invention includes all modifications encompassed within the spirit and scope of the following claims.

What is claimed is:

1. A plasma chamber temperature control, for use with a plasma chamber having a wall exposed to the plasma, comprising:
   a plurality of first temperature controllers in thermal communication with the plasma chamber wall, the plurality of first temperature controllers each defining at least one fluid conduit therethrough; and
   a plurality of second temperature controllers disposed in thermal communication with the plasma chamber wall, the plurality of second temperature controllers being disposed adjacent to the plurality of first temperature controllers and comprising thermoelectric devices.

2. A plasma chamber temperature control as in claim 1, wherein the plurality of second temperature controllers are disposed between at least selected ones of the first temperature controllers and the plasma chamber wall.

3. A plasma chamber temperature control as in claim 1, wherein the plurality of temperature controllers comprise temperature controlling blocks.

4. A plasma chamber temperature control as in claim 3, wherein the temperature controlling blocks are thermally insulated from each other.

5. A plasma chamber temperature control as in claim 3, wherein each temperature controlling block defines the at least one fluid conduit therethrough.

6. A plasma chamber temperature control as in claim 1, further comprising a fluid supply in fluid communication with the first temperature controllers to enable circulation of a fluid therethrough.

7. A plasma chamber temperature control as in claim 6, wherein the temperature control system further comprises a heater to enable heating of the fluid, and a relatively colder fluid supply, and a valve, the valve being selectively operable to allow selective fluid flow from at least one of the fluid supply and the colder fluid supply.

8. A plasma chamber temperature control as in claim 7, wherein the heaters are electrically controllable.

9. A plasma chanter temperature control as in claim 6, wherein the fluid supply further comprises a relatively hotter fluid supply and a relatively colder fluid supply, and a valve, the valve being selectively operable to allow fluid flow from one of the hotter fluid supply and the colder fluid supply.

10. A plasma chamber temperature control as in claim 9, wherein the valve-is further selectively operable to allow fluid flow from a combination of the hotter fluid supply and the colder fluid supply.

11. A plasma chamber comprising:
a chamber having a wall exposed to the plasma;
a plurality of temperature controlling blocks disposed in thermal communication with the plasma chamber wall, each temperature controlling block having a fluid conduit therethrough;
a plurality of thermoelectric devices, disposed between at least selected ones of the temperature controlling blocks and the plasma chamber wall; and
a fluid supply in fluid communication with the conduits to enable circulation of a fluid therethrough.

12. A plasma chamber as in claim 11, wherein the temperature controlling blocks are thermally insulated from each other.

13. A plasma chamber as in claim 11, wherein the temperature controlling blocks are disposed outside of the plasma chamber.

* * * * *